(12) United States Patent
Sekiguchi et al.

(10) Patent No.: US 10,593,512 B2
(45) Date of Patent: Mar. 17, 2020

(54) LIGHT GUIDE, DETECTOR HAVING LIGHT GUIDE, AND CHARGED PARTICLE BEAM DEVICE

(71) Applicant: Hitachi High-Technologies Corporation, Minato-ku, Tokyo (JP)

(72) Inventors: Yoshifumi Sekiguchi, Tokyo (JP); Shin Imamura, Tokyo (JP); Hajime Kawano, Tokyo (JP); Shahedul Hoque, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/082,745

(22) PCT Filed: Feb. 3, 2017

(86) PCT No.: PCT/JP2017/003884
§ 371 (c)(1),
(2) Date: Sep. 6, 2018

(87) PCT Pub. No.: WO2017/169101
PCT Pub. Date: Oct. 5, 2017

(65) Prior Publication Data
US 2019/0115186 A1    Apr. 18, 2019

(30) Foreign Application Priority Data

Mar. 31, 2016  (JP) .................................. 2016-069943

(51) Int. Cl.
*H01J 37/20*  (2006.01)
*H01J 37/26*  (2006.01)
(Continued)

(52) U.S. Cl.
CPC ............ *H01J 37/244* (2013.01); *H01J 37/28* (2013.01); *H01J 2237/2443* (2013.01); *H01J 2237/2445* (2013.01)

(58) Field of Classification Search
CPC .. H01J 37/244; H01J 2237/2443; H01J 37/20; H01J 2237/2007; H01J 2237/2444;
(Continued)

(56) References Cited

U.S. PATENT DOCUMENTS 6,781,124 B2 * 8/2004 Hayn .................... H01J 37/244
                                                       250/310
7,745,786 B2 * 6/2010 Fama .................... H01J 37/224
                                                       250/309
(Continued)

FOREIGN PATENT DOCUMENTS

JP         2014-67526 A      4/2014

OTHER PUBLICATIONS

International Search Report (PCT/ISA/210) issued in PCT Application No. PCT/JP2017/003884 dated May 30, 2017 with English translation (seven (7) pages).
(Continued)

*Primary Examiner* — David A Vanore
(74) *Attorney, Agent, or Firm* — Crowell & Moring LLP

(57) ABSTRACT

The present invention provides a light guide capable of guiding light generated by a scintillator at high efficiency to a photoreceiving element, a detector, and a charged particle beam device. For attaining the purpose, the present invention proposes a light guide that guides light generated by a scintillator to a photoreceiving element, provided with a scintillator containment portion formed of a first surface facing a surface opposite to a charged particle incident surface of the scintillator and a second surface facing a surface different from the surface opposite to the charged
(Continued)

particle incident surface of the scintillator, and a tilted surface reflecting light incident from the second surface to the inside of the light guide.

9 Claims, 10 Drawing Sheets

(51) Int. Cl.
*H01J 37/244* (2006.01)
*H01J 37/28* (2006.01)

(58) Field of Classification Search
CPC ..... H01J 2237/24455; H01J 2237/2806; H01J 37/224; H01J 37/226
USPC ... 250/310, 397, 368, 311, 306, 370.11, 399
See application file for complete search history.

(56) References Cited

U.S. PATENT DOCUMENTS

| | | | |
|---|---|---|---|
| 8,294,097 B2 * | 10/2012 | Katane | H01J 37/244 250/310 |
| 8,829,451 B2 * | 9/2014 | Wang | G01T 1/2002 250/368 |
| 8,895,935 B2 | 11/2014 | Wang et al. | |
| 9,431,211 B2 * | 8/2016 | Sharma | H01J 37/226 |
| 10,236,155 B2 * | 3/2019 | Cheifetz | H01J 37/244 |
| 10,364,900 B2 * | 7/2019 | Hara | F16K 11/0743 |
| 10,365,287 B2 * | 7/2019 | Sakai | G01N 33/48721 |
| 2003/0010913 A1 * | 1/2003 | Essers | H01J 37/244 250/310 |
| 2005/0173644 A1 * | 8/2005 | Gnauck | H01J 37/244 250/370.11 |
| 2006/0186337 A1 * | 8/2006 | Hatano | H01J 37/244 250/310 |
| 2013/0234032 A1 * | 9/2013 | Wang | H01J 37/244 250/368 |
| 2015/0214002 A1 * | 7/2015 | Imamura | H01J 37/244 250/310 |
| 2017/0069458 A1 * | 3/2017 | Shouji | H01J 37/20 |
| 2018/0286627 A1 * | 10/2018 | Ueno | H01J 37/147 |
| 2019/0103250 A1 * | 4/2019 | Yokosuka | H01J 37/28 |
| 2019/0115186 A1 * | 4/2019 | Sekiguchi | H01J 37/244 |

OTHER PUBLICATIONS

Japanese-language Written Opinion (PCT/ISA/237) issued in PCT Application No. PCT/JP2017/003884 dated May 30, 2017 (six (6) pages).

* cited by examiner

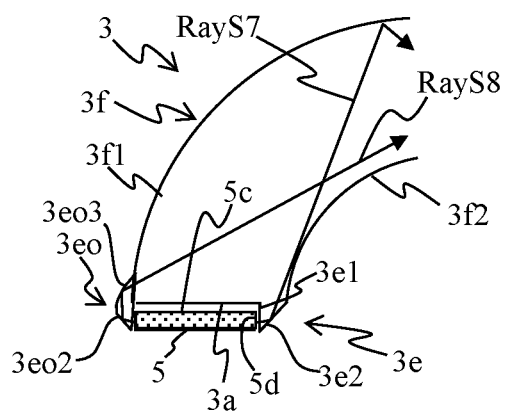
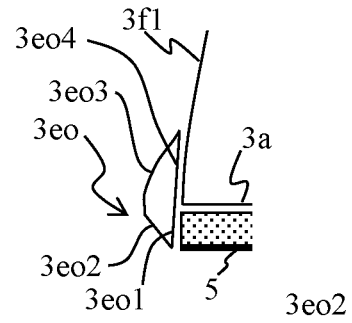
FIG. 10A
FIG. 10B
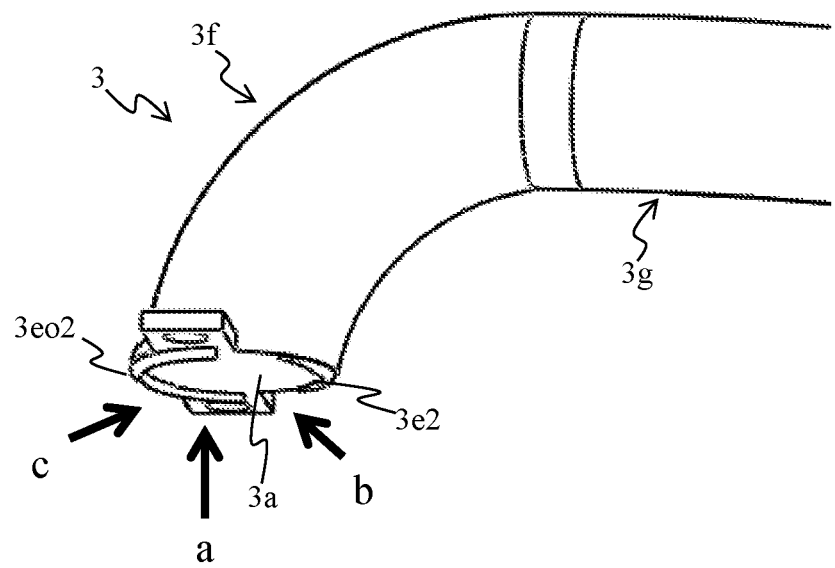
FIG. 10C

LIGHT GUIDE, DETECTOR HAVING LIGHT GUIDE, AND CHARGED PARTICLE BEAM DEVICE

TECHNICAL FIELD

The present invention concerns a light guide, a detector having the light guide, and a charged particle beam device, and more in particular, it relates to a light guide for guiding light at high efficiency to a photoreceiving element, a detector having the light guide, and a charged particle beam device.

BACKGROUND ART

A charged particle beam device for detecting charged particles obtained by irradiation of a sample with a charged particle beam such as an electron beam has a detector for detecting the charged particles. For example, in a case of detecting electrons emitted from a sample by scanning a sample, an electron beam of a positive voltage at about 10 kV is applied to an electron detector, thereby guiding the electrons to a scintillator of the charged particle detector. Light generated in the scintillator by collision of electrons is guided along a light guide, converted into electric signals by a photoreceiving element such as a photomultiplier tube to form image signals or waveform signals.

Patent Literature 1 describes a light guide attached to a scintillator. Further, Patent Literature 1 describes a configuration of providing a tilted surface to a light guide for guiding light emitted from the scintillator to a PMT (photomultiplier tube). Patent Literature 2 describes a light guide using a material of high transparency, for example, an acrylic resin. Further, the cited reference 2 shows a device of guiding light generated in a scintillator by way of a light guide and allow the light to enter a photoelectric conversion element including, for example, a photomultiplier tube or a semiconductor photoreceiving element. Further, it describes a scintillator structure in which a surface on the side opposite to the incident surface of the electrons is formed as a tilted surface in order to guide light at high efficiency to the light guide.

CITATION LIST

Patent Literature

Patent Literature 1: U.S. Pat. No. 8,895,935
Patent Literature 2: Japanese Unexamined Patent Application Publication No. 2014-67256 (corresponding to USP Laid-Open Publication No. US 2015/0214002)

SUMMARY OF INVENTION

Technical Problem

On the other hand, light generated in the scintillator is guided through the light guide to the photoreceiving element, which includes light colliding against the wall surface of the light guide in the course of reaching the photoreceiving element. The collided light goes by reflection toward the photoreceiving element, some of which transmits to the outside of the light guide. When light can be guided to the photoreceiving element while suppressing transmission of light to the outside of the light guide, an SN ratio of the charged particle beam device can be improved. According to the light guide disclosed in Patent Literature 1, light generated in the scintillator can be guided to the PMT by reflecting light generated in the scintillator at the tilted surface of the light guide on the side opposite to the scintillator attaching surface. However, as described above, light colliding against the wall surface of the light guide includes light which may occasionally transmits therethrough without reflection to restrict high detection efficiency. Further, it may be considered to make a relative angle larger between the tilted surface on the side opposite to the scintillator attaching surface and the attaching surface, so as to reflect as much light incident to the tilted surface as possible. In this case, however, it may be considered that the size of the light guide increases in the direction of the optical axis of an electron microscope, etc. and the member is not suitable as one being disposed in a restricted space inside a vacuum chamber.

According to the detector structure disclosed in Patent Literature 2, while light emitted from the lateral side of the scintillator can be guided to the photoreceiving element, light sometimes transmits from the surface on the side opposite to the collision surface of the charged particles of the scintillator, which also poses a limit on high efficient detection.

A light guide, with an aim of effectively guiding light generated in a scintillator to a photoreceiving element at high efficiency, a detector having the light guide, and a charged particle beam device are to be proposed.

Solution to Problem

For attaining the purpose described above, it is proposed, in one aspect, a light guide for guiding light generated from a scintillator to a photoreceiving element, including: a scintillator containment portion formed of a first surface facing a surface opposite to a charged particle incident surface of the scintillator and a second surface facing a surface of the scintillator different from the surface opposite to the charged particle incident surface; and a tilted surface for reflecting a light incident from the second surface to the inside of the light guide.

For attaining the purpose described above, it is proposed, in another aspect, a detector including: a scintillator; and a light guide for guiding light generated from the scintillator to a photoreceiving element, in which the light guide includes a concave portion formed of a first surface facing a surface opposite to a charged particle incident surface of the scintillator and a second surface facing a surface different from the surface opposite to the charged particle incident surface of the scintillator, and a tilted surface reflecting light incident from the second surface to the inside of the light guide, and the scintillator is contained in the concave portion.

For attaining the purpose described above, it is proposed, in another aspect, a charged particle beam device including a detector for detecting at least one of charged particles emitted from a sample based on irradiation of a charged particle beam emitted from a charged particle source and charged particles generated by collision of charged particles emitted from the sample against another member, in which the detector includes a scintillator and a light guide for guiding light generated from the scintillator to a photoreceiving element, in which the light guide includes a concaved portion formed of a first surface facing a surface opposite to a charged particle incident surface of the scintillator and a second surface facing a surface different from the surface opposite to a charged particle incident surface of the scintillator, and a tilted surface for reflecting light incident from the second surface to the inside of the light guide, and the scintillator is contained in the concave portion.

Advantageous Effects of Invention

According to the configuration, light generated from the scintillator can be guided at high efficiency to the photoreceiving element.

BRIEF DESCRIPTION OF DRAWINGS

FIGS. 10A to 10C are views explaining a specific shape of the light guide.

DESCRIPTION OF EMBODIMENTS

In the charged particle detector using the scintillator as the detection element, highly efficient detection of charged particles can be attained by guiding light generated inside the scintillator at high efficiency. On the other hand, the scintillator in the sterical shape has a plurality of surfaces and emits light from all surfaces of the scintillator not having a reflection material of reflecting light, but light emitted from the scintillator surface not facing the light guide cannot be guided. That is, only the light emitted from a portion of the surface can be incident to the light guide. Further, in a case where the light guide is not linear but has a bent portion, light leaks in the bent portion and does not reach the photoreceiving element. Accordingly, light emitted from the scintillator cannot be propagated sufficiently to the photoreceiving element. That is, in the optical system using the light guide, the ratio of light reaching the photoreceiving element relative to light emitted from the scintillator (light utilization efficiency) is often low.

A light guide for improving the light utilization efficiency is to be described. In this embodiment, a charged particle beam device provided with a detector using a scintillator as a detection element and having a light guide between the scintillator and the photoreceiving element is to be described. In the following example to be described below, an example of an electron microscope, in particular, a scanning electron microscope is to be explained. However, this is not restrictive but the examples to be described below are applicable also to other charged particle beam devices such as a scanning ion microscope using an ion beam. Further, the examples are applicable also to a measuring device, an inspection device, an observation device, etc. for a semiconductor pattern using a scanning electron microscope.

The scintillator in the present specification means an element that generates light upon incidence of a charged particle beam. The scintillator referred to in the present specification is not restricted to those illustrated in the examples but can be in various shapes and structures.

«First Embodiment»

Figure 1:
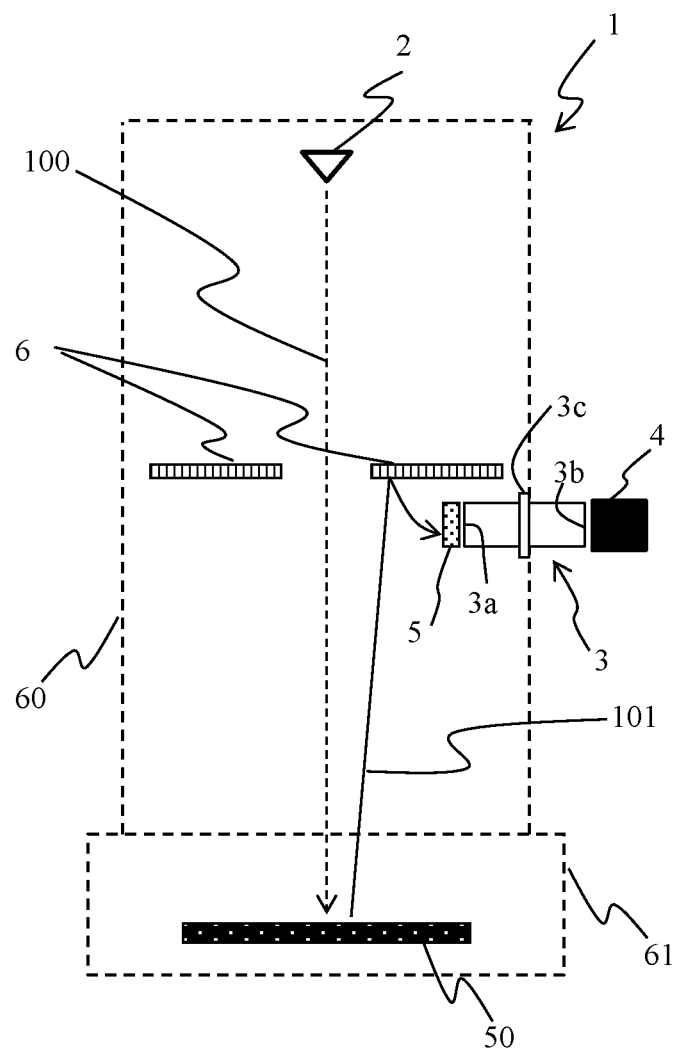
FIG. 1 is a view illustrating a structure of an electron microscope.
Figure 2:
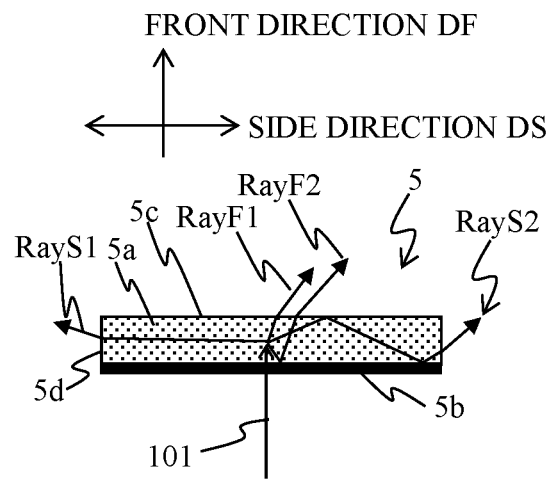
FIG. 2 is a view illustrating an example of light passage in a scintillator.
Figure 3:
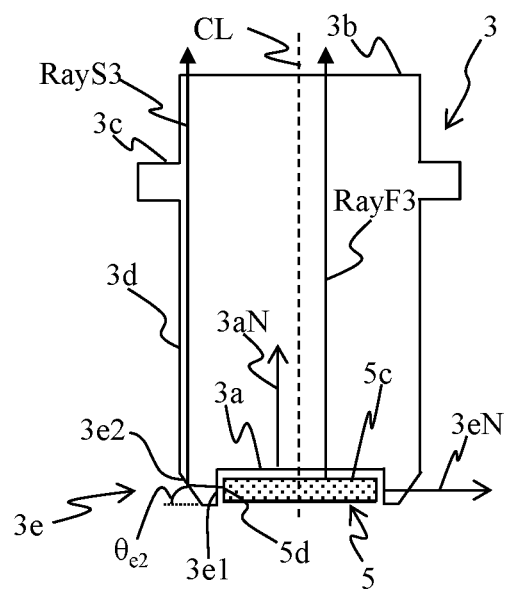
FIG. 3 is a view illustrating an example of a light guide having a scintillator containment space and a side prism.

FIG. 1 is a view illustrating a basic configuration of an electron microscope 1. FIG. 1 is a view observing an electron microscope from the side, and FIG. 2 and FIG. 3 are detailed views of a scintillator 5 and a light guide 3. A primary electron beam 100 emitted from an electron source 2 irradiates on a sample 50, from which secondary particles 101 such as secondary electrons or reflected electrons are emitted. The secondary particle 101, after collision against a signal particle control plate 6, is incident to the scintillator 5. Particles after collision against the signal particle control plate 6 are sometimes referred to as tertiary particles but, for simplifying the explanation, secondary particles emitted from the sample 50 and secondary electrons generated by collision of secondary particles emitted from the sample against the signal particle control plate 6 are inclusively referred to as the secondary particles. In this embodiment, a scintillator 5 having a circular secondary particle incident surface is to be explained. In this example, a columnar scintillator having a smaller size in the height relative to the size of the secondary particle incident surface is to be explained as an example. When the secondary particles 101 are incident to the scintillator 5, luminescence occurs in the scintillator 5. Luminescence in the scintillator 5 is guided by way of a light guide 3 and converted by a photoreceiving element 4 into electric signals. Hereinafter, the scintillator 5, the light guide 3, and the photoreceiving element 4 are sometimes collectively referred to as a detection system.

In the case of the scanning electrode microscope, signals obtained at the photoreceiving element 4 are stored in a memory medium such as a frame memory in synchronization with scanning of the primary electron beam (electron beam). By display of brightness in accordance with an amount of signals obtained at an image position (pixel) corresponding to an electron beam irradiation position, a contrast image can be formed in a scanning region. In FIG. 1, an electron optical system for focusing a primary electron beam 100 to irradiate the sample, that is, a reflector, a lens, a diaphragm, an objective lens, etc. is not illustrated.

Inside of an electron optical column 60 constituting the electron optical system is kept in a vacuum state and configured such that a beam passes through the vacuum space. Further, a sample 50 is placed on a sample stage for moving the sample at least in X-Y direction (assuming an ideal optical axis of the primary electron beam as Z direction), and the sample 50 and the sample stage are located in a sample chamber 61. The sample chamber 61 is generally kept in a vacuum state during electron beam irradiation. Further, the electron microscope is provided with a control unit for controlling the operation of the entire system and each part, a display unit for displaying images, an input unit for inputting a user's operation instruction to the electron microscope, etc. although not illustrated. Further, an unillustrated negative voltage applying power source is connected to the sample stage, which can form a deceleration electric field to the electron beam. Since the deceleration electric field to the electron beam is an acceleration electric field to the secondary particles emitted from the sample (secondary electrons and backward scattering electrons), the secondary particles, etc. are accelerated in the direction to the electron source 2 and collide against the signal electron control plate 6, etc.

The electron microscope is an example of configuration and other configurations may also be applied so long as the electron microscope has a scintillator 5, a light guide 3, and a photoreceiving element 4. In the example of FIG. 1, an example of detecting new secondary particles generated based on the collision of the secondary particles against the signal electron control plate 6 (tertiary particles) is explained, but it may be configured such that a scintillator is located at a position of the signal electron control plate 6 and light generated from the scintillator is guided to the photoreceiving element through a light guide.

Further, the secondary particles 101 include also transmission electrons, scanning transmission electrons, etc. Further, although only one detector is shown for the sake of simplification, a plurality of detectors may also be provided. A detector for reflection electron detection and a detector for secondary electron detection may be provided separately or a plurality of detectors may be provided for discrimination and detection of an azimuth angle or an elevation angle.

Then, the scintillator 5 of this embodiment is to be described in details with reference to FIG. 2. In FIG. 2, the front direction DF is a direction in parallel with a normal line on the bottom of a columnar scintillator 5 (referred to as an upper bottom 5*c* in order to distinguish the upper and lower bottoms of a column), which is a direction along which particles 101 propagate. The side direction DS is a direction perpendicular to the front direction DF. The drawing is a view of observing the columnar scintillator 5 along the side direction DS. The scintillator 5 includes a light emission part 5*a* that converts the energy of the incident secondary particle 101 to light and generates light and a conduction layer 5*b* for applying a voltage to the scintillator 5. The conduction layer 5*b* is a layer formed by lamination over the light emission part 5*a* which is an Al layer in this embodiment. However, it may suffice that the scintillator 5 has a light generation part 5*a* and the configuration is not limitative to this.

The material of the light emission part 5*a* includes semiconductors (GaN, Si, SiC), ceramic phosphors YAG ($Y_3Al_5O_{12}$:Ce), YAP ($YAlO_4$:Ce), powdery phosphors $Y_2SiO_5$:Ce, which are used being deposited on a substrate, etc. An example of the semiconductor scintillator includes a semiconductor having, as a photoconversion portion, a structure of forming a quantum well by laminating InGaN and GaN. The InGaN layer and the GaN layer are laminated to the incident direction of the charged particles.

The secondary particles 101 incident to the scintillator 5 are passed through the conduction layer 5*b* and converted into light in the light emission part 5*a*, and the converted light is propagated through the light emission part 5*a* and emitted to the outside of the scintillator 5. Since the conduction layer 5*b* functions as a reflection member to the light, light is emitted from all of the surfaces having no conduction layer 5*b*.

Examples of light were shown in the drawing as RayF1, RayF2, RayS1, and RayS2. RayF1 and RayF2 are examples emitting from the upper bottom surface 5*c* in the front direction DF and RayF2 is an example reflected on and emitted from the conduction layer 5*b*. RayS1 and RayS2 are examples of propagating in the side direction DS and emitting from the side 5*d*. RayS2 shows an example of totally reflecting at the upper bottom 5*c*, reflecting at the conduction layer 5*b* and emitting from the side 5*d*, which is an example of being guided in the light generation part 5*a* and emitted from the side 5*d*. Since the light generation part 5*a* has a refractive index higher than that of air, a portion of the light is guided while totally reflecting at the surface of the scintillator 5.

The ratio between the sum of light emitting from the side 5*d* (side emission amount ls) and the sum of light emitting from the upper bottom surface 5*c* (surface emission amount lp) depends on the inner structure of the scintillator 5. In a case of using a scintillator including a semiconductor or a ceramic phosphor material or a case of using a substrate with deposition of a powdery phosphor material as a scintillator and taking out and utilizing light also from the substrate, the refractive index of materials is generally larger than 1.5, and the total reflection angle for the surface of the scintillator 5 is about 40 degrees at a refractive index of 1.5. Therefore, about 75% or more of the light incident to the surface undergoes total reflection. When the inside of the light emission part 5*a* has a structure tending to cause scattering, light sometimes causes random reflection to reach the surface again and emit from the surface. Since the scintillator described above is in a configuration of causing less optical scattering, light is guided to the side 5*d*, and a great amount of light emits also from the side 5*d*. In a case of a scintillator 5 using GaN as the material according to simulation, lp:ls=about 1:1 for 0.5 mm in height and 9 mm in diameter of the column. Further, even when a technique is introduced which introduces a pattern structure of a pyramid, corn, etc. or a pattern structure about at or less than the light wavelength in the light emission part 5*a*, and suppresses light guidance by scattering, thereby improving the surface light emission amount lp from the upper bottom 5*c*, lp:ls=about 7:3. Accordingly, it is important to dispose also the lateral side emission amount ls by the light guide, thereby improving the light yield.

Then, the light guide 3 is to be explained with reference to FIG. 3. FIG. 3 is a cross sectional view of the light guide 3 and the light guide 3 has a rotational symmetric shape with respect to a center line CL. As a material for the light guide 3, PMMA resin, cycloolefin polymer (COP) resin, silica, quartz, etc. maybe used. However, the present invention is not restricted to the material.

A separation flange 3*c* is provided to the side 3*d* of the light guide column for separating the vacuum inside the electron optical column 60 and the atmospheric air in the outside. The separation flange 3*c* depends or does not depend on the structure of the electron microscope 1. In this embodiment, since the photoreceiving element 4 is disposed outside of the electron optical column 60 and the scintillator 5 is disposed inside the electron optical column 60, the separation flange 3*c* is provided to the light guide 3.

The emission surface 3*b* of the light guide 3 is circular which is a surface opposed to the photoreceiving element 4. The surface facing the upper bottom 5*c* of the scintillator 5 is an incident surface 3*a* (first surface) of the light guide 3. The light incident from the incident surface 3*a* is partially absorbed in the light guide 3, but most of it reaches the emission surface 3*b*. Ray F3 is an example of light incident from the incident surface 3*a* to the light guide and emits from the emission surface 3*b*.

A portion disposed opposing to the side 5*d* of the scintillator 5 is a side prism 3*e*, and the side prism 3*e* has a side prism incident surface 3*e*1 (second surface) which opposes to the side 5*d* of the scintillator 5 and to which light is incident from the side 5d. The side prism incident surface 3e1 is a side wall surface having a direction of plane in the direction different from the incident surface 3a of the light guide 3.

Further, the incident surface 3a of the light guide 3 and the side prism incident surface 3e1 define a containment space surrounding the scintillator 5. For receiving all the light from the scintillator 5, the containment space is formed preferably so as to oppose to all the surfaces from which the light of the scintillator 5 emits. However, even if the containment space is configured such that the opposing surface is formed only to a portion of the surface from which light of the scintillator 5 emits, it provides an effect of improving the light utilization efficiency so long as it has a side wall surface.

The side prism 3e has a reflection surface 3e2 (tilted surface) of reflecting the light incident from the side prism incident surface 3e1 so as to direct the light to the emission surface 3b. The reflection surface 3e2 is formed so as to surround the side prism incident surface 3e1. RayS3 is an example of light incident from the incident surface 3e1 to the side prism 3e, totally reflecting at the reflection surface 3e2 and emitting from the emission surface 3b. This embodiment has a configuration that the reflection surface 3e2 has a predetermined angle $\theta_{e2}$ relative to the direction of the normal line 3eN on the side prism incident surface 3e1, thereby capable of totally reflecting light incident in the direction of the normal line 3eN on the side prism incident surface 3e1.

Total reflection occurs only in a case where the incident angle of light to the reflection surface 3e2 is larger than the critical angle $\theta_c$. Preferably, the incident light also includes light at angles other than the angle in the direction of the normal line 3eN, and a reflection member is preferably provided to the surface of the reflection surface 3e2 in order to reflect more light. The reflection member includes, for example, aluminum, silver, multilayered reflection films, etc.

With respect to the angle $\theta_{e2}$, it is preferably larger than 20 degrees and smaller than 70 degrees with a viewpoint of reflection in the direction of the emission surface 3b. However, the upper limit of the angle depends on the shape of the light guide 3, and the angle takes other values in a case of a bent light guide 3, for example. Since the reflection light can be propagated to the emission surface 3b by properly setting the angle $\theta_{e2}$, this provides an advantageous effect of improving the light unitization efficiency.

Further, the angle $\theta_{e2}$ for reflection in the direction of the normal line 3aN on the incident surface 3a does not depend on the shape of the light guide 3 and is preferably within a range of 45 degrees±15 degrees. Since most of light propagating in the direction of the normal line 3aN on the incident surface 3a does not leak from the portion other than the emission surface of the light guide 3 but can be guided through the light guide 3, this can provide an advantageous effect of improving the light utilization efficiency.

By the side prism. 3e, since the emission light from the side 5b of the scintillator 5 can also be incident to the light guide 3 and reflect at the reflection surface 3e2 to the emission surface 3b and more light can be propagated to the photoreceiving element 4, this can provide an advantageous effect of improving the light utilization efficiency. Usually, in the scintillator, the surface in the direction of the thickness of the surface in the direction perpendicular to the incident surface (side) is sufficiently smaller than the size in the direction of the plane of the incident surface of the charged particles. Accordingly, it is configured such that light emitted from the upper bottom surface 5c is guided in the direction of the center line CL of the light guide (optical channel direction of the light guide) with no reflection using the prism or the like and guide light emitted from the side of the scintillator is in the direction of the light guide optical channel accompanying reflection of using the side prism. That is, in a case of forming a containment space of the scintillator 5 in the light guide 3, the size in the direction of the height of the side prism incident surface 3e1 is defined smaller than that of the incident surface 3a, and arranged so as to oppose the side 5d of the scintillator 5 to the side prism incident surface 3e1 of the light guide 3, and the upper bottom 5c of the scintillator and the incident surface 3a of the light guide 3, respectively.

With the configuration described above, the light emitted from each of the surfaces of the scintillator can be guided at high efficiency to the detection element while decreasing the amount of light changing the propagation direction by reflection in the light guide.

Then, modifications of the reflection surface 3e2 are to be explained with reference to FIG. 4. FIG. 4 is an enlarged cross sectional view for the vicinity of the side prism 3e.

Figure 4A:
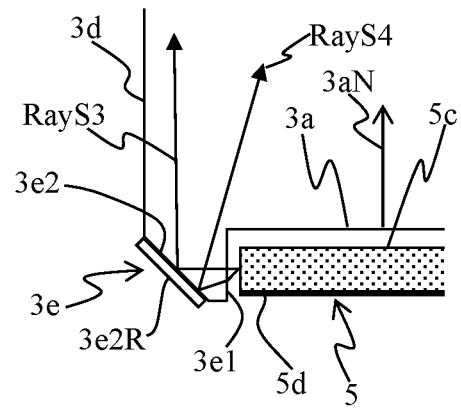
FIGS. 4A to 4C explaining a modification of a side prism.

FIG. 4(a) shows an example of attaching a reflection member 3e2R to the surface of a reflection surface 3e2. By provision of the reflection member 3e2R, the light incapable of total reflection at the reflection surface 3e2 but transmits therethrough can also be reflected to improve the light utilization efficiency. Light RayS4 is loss light transmitting the reflection surface 3e2 in a case where the reflection member 3e2R is not present. If the reflection member 3e2R is present, light is reflected and guided to the emission surface 3b. The reflection member may be attached by various methods such as vapor deposition in addition to bonding, and this embodiment is not restricted by the way of attachment. In this embodiment, the reflection member does not entirely cover the light guide but attached only to a portion of the light guide (reflection surface). Since a usual reflection material absorbs a portion of light upon reflection, the material is not bonded to the side 3d of the light guide where light reflects by plural times. The absorption ratio in a case of using a metal as the reflection material is about 5 to 15%. It is important that the side 3d guides light by total reflection without causing light absorption.

Figure 4B:
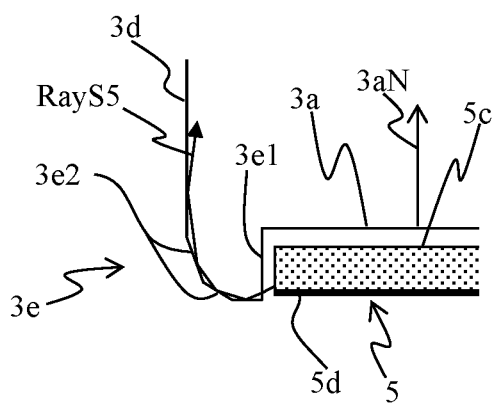

FIG. 4(b) shows a case where the shape of the reflection surface 3e2 is not linear but a polygonal line. The propagation direction of light is changed by plural reflections. As an example, an example of light RayS5 was illustrated.

Figure 4C:
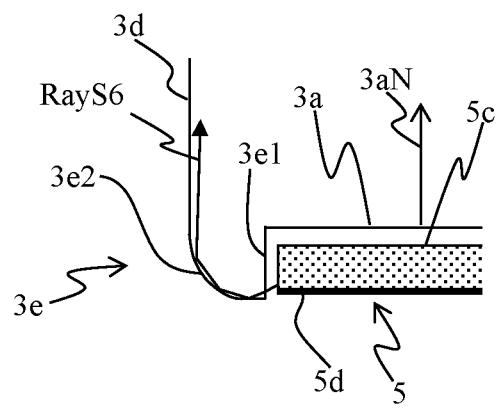

FIG. 4(c) shows a case where the shape of the reflection surface 3e2 is not linear but a curve. The light propagation direction is changed by plural reflections. As an example, light RayS6 was illustrated. The configuration of the curve may be considered to be various shapes such as circular, elliptic, parabolic or hyperbolic. It is not restricted only to the curve but maybe a combination of a curve and a polygonal line or a curve and a linear line. For the shape of the reflection surface 3e2, any shape of reflecting light so as to propagate to the emission surface 3b can provide an advantageous effect of improving the light utilization efficiency.

<<Second Embodiment>>

Figure 5A:
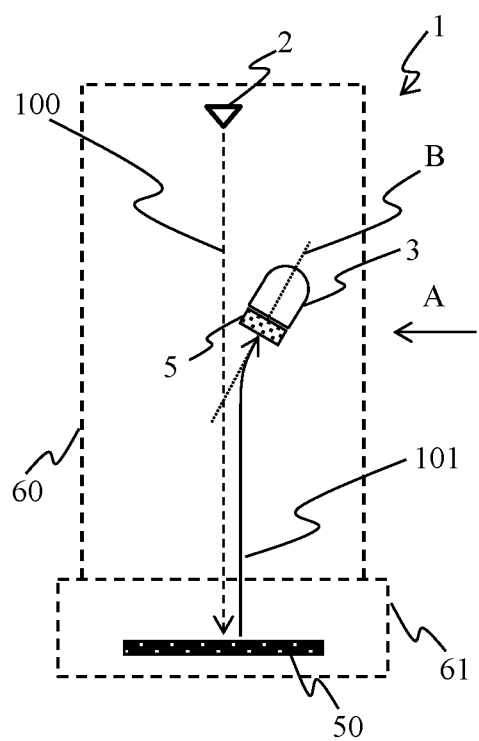
FIGS. 5A and 5B are views illustrating a structure of an electron microscope.
Figure 5B:
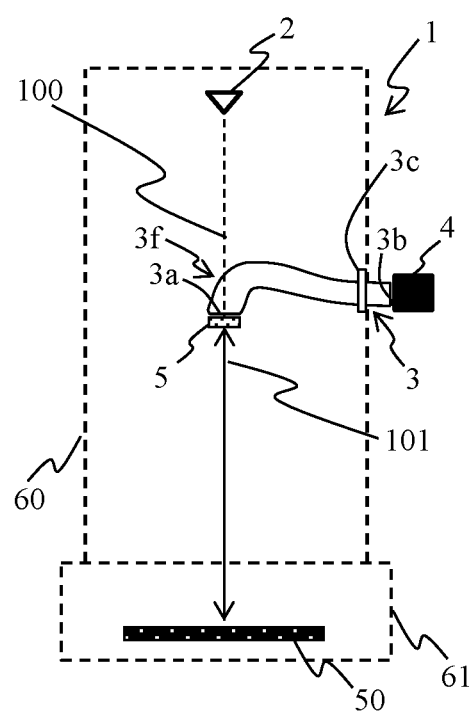

FIGS. 5 and 6 are views for explaining a second embodiment. Identical portions or portions having identical functions with those of the first embodiment are not explained. Further, portions carrying identical reference numerals are those portions having similar functions. FIG. 5(a) is a side elevational view of an electron microscope. FIG. 5(b) is a view of the electron microscope 1 in the direction of an arrow A in FIG. 5(a). Assuming a plane containing a dotted line B and the center of the emission surface as plane S1, FIG. 6(a) is a cross sectional view of a light guide 3 in the plane S1. Further, the plane S1 is a surface also containing the center of the incident surface 3a.

An electron microscope as illustrated in FIG. 5 has no signal particle control plate as illustrated in FIG. 1, and secondary particles 101 are directly incident to a scintillator 5. Further, when compared with the example of FIG. 1, the shape of the light guide is different. In the light guide 3 of this embodiment, since the incident surface 3a and the emission surface 3d are not faced (the scintillator emission surface is not present in the direction of the normal line on the incident surface of the scintillator), a bent portion 3f is provided in the light guide 3.

For the sake of simplicity, only one detection system is shown but plural detection systems may be provided or another detection system including a signal particle control plate may also be provided. Although not illustrated in this embodiment, another detection system having a signal particle control plate is provided on the side nearer to the sample 50 than the illustrated detection system.

The electron optical system of this embodiment has an optical system in which a primary electron beam 100 emitted from an electron source 2 goes straight to the sample 50, while the secondary particles 101 can be bent to the scintillator 5. Since the secondary particles 101 are in direct incident to the scintillator 5, secondary particles 101 propagating linearly from the sample 50 can be detected at high sensitivity.

As shown in FIG. 5(b), the light guide 3 has a bent portion 3f and light is also guided to the emission surface 3b while undergoing reflection in the bent portions 3f and reaches the photoreceiving element 4. The cross sectional shape is to be explained in details with reference to FIG. 6(a). The cross sectional shape generally includes three portions. They are three portions including bent portions 3f1, 3f2, tilted portions 3g1, 3g2 the shape of which changes more gradually than that of the bent portions, and linear portions 3h1, 3h2.

Figure 6A:
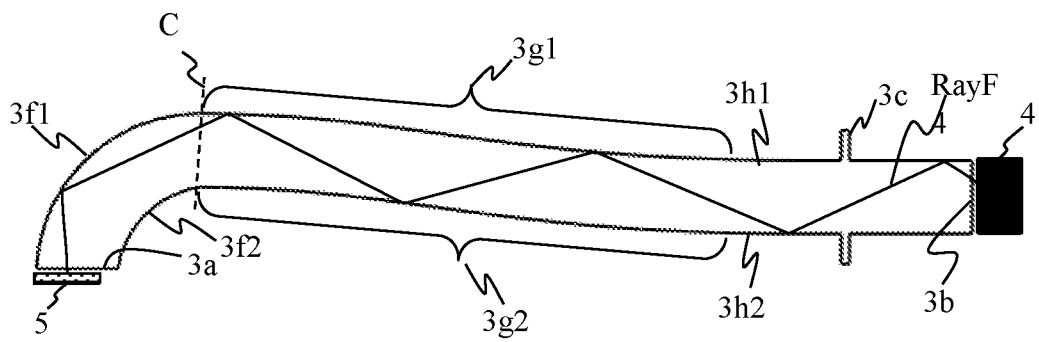
FIGS. 6A to 6D are views illustrating an example of a light guide having a bent portion.
Figure 6B:
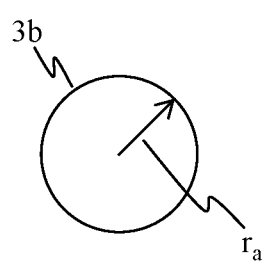
Figure 6C:
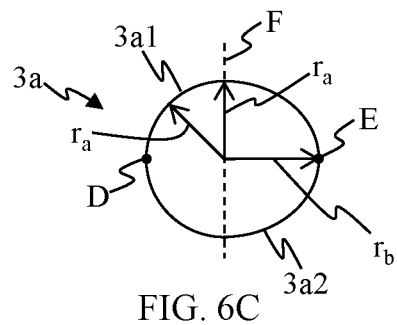

The shape of the linear portion 3h is a columnar shape having an emission surface 3b as a bottom (a circle with radius $r_a$, refer to FIG. 6(b)). A separation flange 3c is provided to the linear portion 3h. By provision of the separation flange 3c in the linear portion 3h, the separation flange 3c can be abutted vertically against the side wall, etc. of the electron optical column 60 to suppress flowing of atmospheric air into vacuum.

The tilted portion 3g has a shape of connecting the bent portion 3f and the linear portion 3h. The cross sections 3g1, 3g2 are in the shape of moderately changing curves. The cross sectional shape is not restricted to that of the curve but may be formed of a linear line, a polygonal line, a combination of curve and linear line or a combination of curve and polygonal line.

The cross sectional shapes 3f1, 3f2 of the bent portion are arcs having a central angle between 60 degrees and 89 degrees in this embodiment. The cross sectional shape may be a curve somewhat deviated from the arc, or may partially include an arc or a curve and partially include a linear or polygonal line. The bent portion is in a complicate shape for reducing the amount of light leaked from the surface of the bent portion to the outside of the light guide. The incident surface 3a is in a shape shown in FIG. 6(c) in which cross sectional shapes 3f1 and 3f2 are connected to the points D and E respectively. The left half is a circle 3a1 and the right half is an ellipse 3a2 with respect to the dotted line F as a boundary. The radius of the circle is $r_a$ and one-half length of the short axis and that of the major axis of the ellipse are $r_a$ and $r_b$ respectively ($r_a<r_b$). The center of the scintillator 5 is situated at a position substantially opposing the intersection between the dotted line F and a segment connecting the points D and E.

Figure 6D:
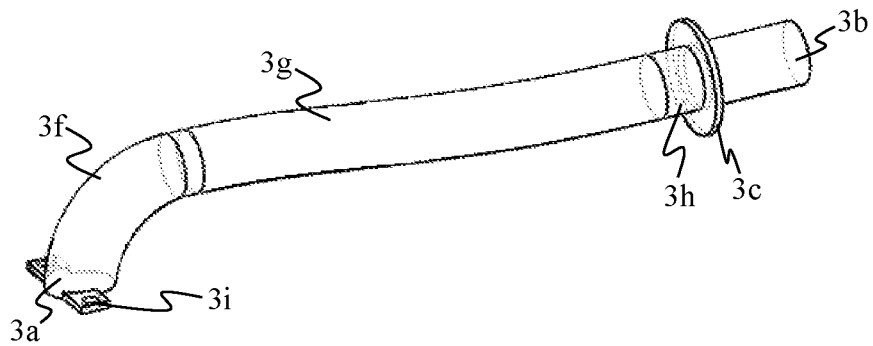

Assuming a plane perpendicular to the plane S1 and containing the dotted line C as a plane S2, the cross sectional shape of the light guide 3 at the plane S2 is a circle identical with that of the emission surface 3b. The shape of the bent portion 3f is a shape of connecting the cross sectional shape of the circle and that of the incident surface 3a with the cross sectional shapes 3f1, 3f2 as a contour. The shape of the bent portion can be prepared by lofting the shape of the circle and the incident surface 3a with the cross sectional shapes 3f2, 3f2 as a contour using, for example, a usual 3D CAD (three-dimensional computer aided design system). FIG. 6(d) is a perspective view of the light guide 3 in this embodiment. Reference numeral 3i shows a portion for fixing the light guide 3 and the scintillator 5.

The shape of the bent portion is to be described more in details with reference to FIG. 7. FIG. 7(a) is a cross sectional view in the plane S1 for explaining the reason of light leakage in the bent portion 3f. In this example, the tilted portion 3g as in the light guide illustrated in FIG. 6 is not present. The shape of the incident surface 3a or that of the emission surface 3b is a circle shown in FIG. 6(b), and the cross sectional shapes 3f1 and 3f2 in the bent portion are an arc with the central angle of 90 degrees and starting from the incident surface 3a. The bent portion 3f and the emission surface 3b are connected by way of a linear portion 3h. This is the simplest light guide shape of connecting the incident surface 3a and the emission surface 3b.

Typical light path of leaking light is to be described with reference to three examples of light. Light RayF5 is an example of reaching the cross section 3f1 in the bent portion and transmitting the surface since the angle relative to the normal line 3N1 on the surface of reaching point is smaller than the critical angle of total reflection. All the light with the angle of light between the normal line on the incident surface 3a and the angle upon emission from the incident surface 3a being larger than the angle shown in the drawing transmits the bent portion 3f to cause loss.

Light RayF6 (shown by dotted line for distinguishing from other light) is an example of totally reflecting in the direction of the normal line of the incident surface 3a on the cross section 3f2 of the bent portion, reaching the cross section 3f1 of the bent portion, and transmitting the surface since the angle relative to the normal line 3N2 on the surface of the reaching point is smaller than the critical angle of total reflection. Light emitting from a position near the cross section 3f2 of the bent portion reflects at the cross section 3f2 of the bent portion and leaks from the light guide 3 through a similar light passage.

Light RayF7 is an example of light emitting from the incident surface 3a being tilted from the normal line on the incident surface 3a to the emission surface 3b, reaching the cross section 3h1 of the linear portion, and transmitting the surface since the angle relative to the normal line 3N3 on the surface of the reaching point is smaller than the critical angle of the total reflection. Light reaching the surface having a normal line substantially in parallel with the normal line on the incident surface 3a has a high possibility of transmitting the surface. The transmittance is in accordance with the Fresnel's transmittance.

Figure 7A:
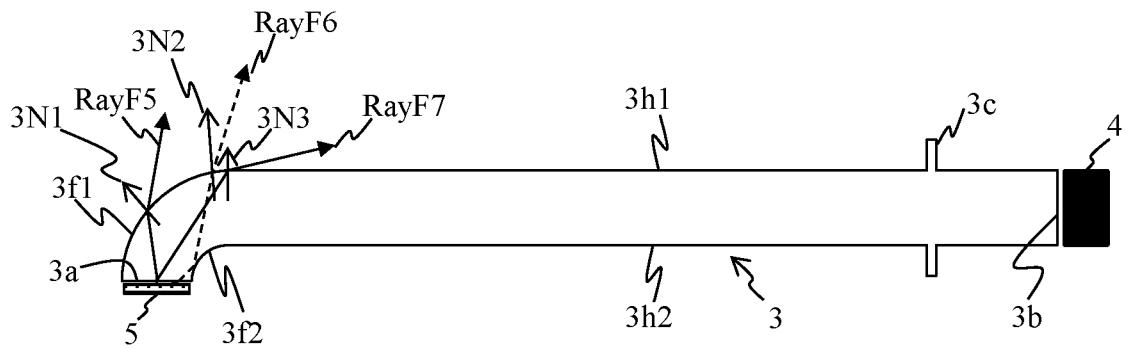
FIGS. 7A to 7D are views explaining an example of a light guide having a tilted portion connecting a bent portion and a linear portion.
Figure 7B:
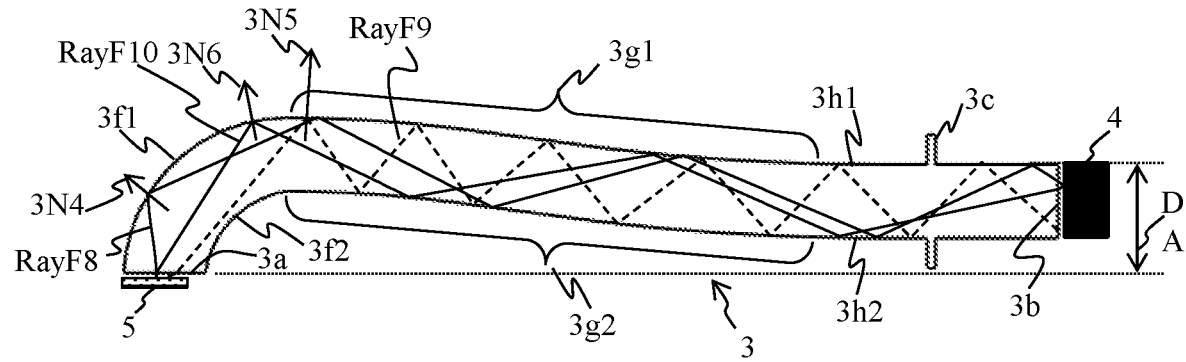
Figure 7C:
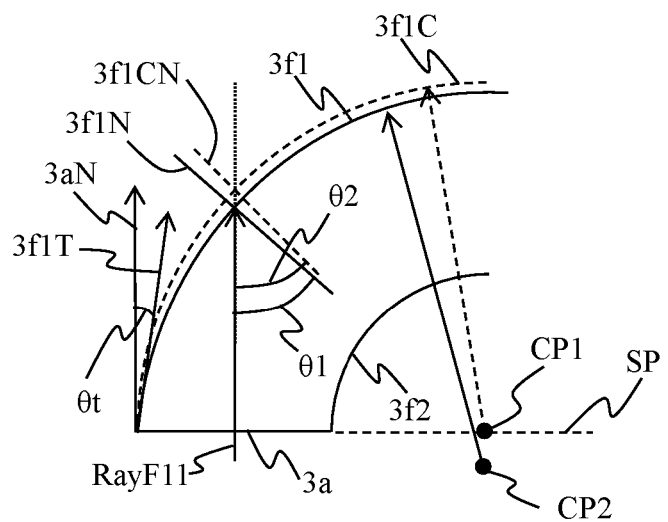

The light guide 3 shown in FIG. 6(a) is in a shape of suppressing such light leakage. The light guide shown in FIG. 7(b) is a light guide 3 shown in FIG. 6(a) and the light leakage suppressing effect is to be described with reference to the drawing. Main features of the light guide 3 in FIG. 7(*b*) are that the radius of curvature at the cross section 3/1 of the bent portion is larger compared with that in FIG. 7(*a*), and the shape of the incident surface 3*a* is a shape including the ellipse where the major axis shown in FIG. 6(*c*) is in the direction of the emission surface. Since the radius of curvature for the cross section 3/1 of the bent portion is large, the surface of the light guide 3 that guides light to the emission surface 3*b* is present in addition to the region between the incident surface 3*a* and the emission surface 3*b*. The region between the incident surface 3*a* and the emission surface 3*b* is a region represented by the arrow DA in FIG. 7(*b*). The dotted line shown by the arrow is an auxiliary line for showing the region in which, in the drawing, the lower dotted line is aligned with the end of the incident surface 3*a* and the upper dotted line is aligned with the end of the emission surface 3*b*. In the light guide with no tilted portion shown in FIG. 7(*a*), the surface of the light guide 3 for guiding the light to the emission surface 3*b* is not present except for the region. The fixing portion such as the separation flange 3*c* is not a surface for guiding the light to the emission surface 3*b*.

When the radius of curvature of the cross section 3/1 of the bent portion is large, total reflection tends to occur in the bent portion. Light RayF8 is light emitted from the incident surface 3*a* at an angle identical with that of the light RayF5 in which the incident angle to the cross section 3/1 of the bent portion is larger than that of the light RayF5 and undergoes total reflection. Since the radius of curvature is large, light is incident at a position where the normal line 3N4 at the light incident position to the arc is tilted greatly from the normal line on the incident surface 3*a*. Accordingly, the amount of light for total reflection in the bent portion increases to improve the light utilization efficiency of the light guide.

Light RayF10 is light that emits from the incident surface 3*a* at an angle identical with that of light RayF7. Since the radius of curvature is large, light RayF10 is incident to the cross section 3/1 in the bent portion near the end point and is guided under total reflection. Since the normal line 3N6 at the cross section 3/1 in the bent portion near the end point is tilted from the incident surface 3*a* in the direction opposing to that of the emission surface 3*b*, the angle between the normal line 3N6 and the incident light is increased tending to cause total reflection. Since the Fresnel reflectivity is improved even if the light does not show total reflection, the amount of reflection light increases to improve the light utilization efficiency of the light guide.

In a case where the scintillator 5 is a column of 9 mm in diameter, it was confirmed by a light tracing calculation that the light utilization efficiency was improved by 37% by defining the incident surface 3*a* to that of a circle of 10 mm in diameter, and by changing the radius of curvature for the cross sections 3/1 and 3/2 in the bent portion from 15 mm and 5 mm to 18 mm and 8 mm respectively.

Light RayF9 is light emitted from the incident surface 3*a* at an angle identical with that of light RayF6. Light RayF9 can reach the cross section 3*g*1 of the tilted portion without reflection at the cross section 3/2 by forming a portion of the incident surface 3*a* as an ellipse where the major axis is in the direction of the emission surface and displacing the cross section 3/2 of the bent portion toward the emission surface 3*b*. Light RayF9 does not always cause total reflection at the cross section 3*g*1. Since the angle between light RayF9 and the normal line 3N5 is increased at the incident point on the cross section 3*g*1 compared with the case of light RayF6, the Fresnel reflectivity is increased, and the amount of guided light is increased to improve the light utilization efficiency.

Then, the shape of the elliptic portion of the incident surface 3*a* is to be described. For example, in a case where the radius of the scintillator 5 is 4.5 mm, and $r_a$ and $r_b$ are defined as 4.5 mm and 5.5 mm respectively in FIG. 6(*c*), it was confirmed by the light tracing calculation that the light utilization efficiency was improved by several % compared with the case of defining the incident surface 3*a* as a circle of 9 mm in diameter. In this embodiment, the light utilization efficiency has been improved by forming a portion of the incident surface 3*a* to an ellipse and making the shape longer on the side of the emission surface, thereby transferring the cross section 3/2 toward the emission surface. However, the embodiment is not restricted to define a portion of the incident surface 3*a* to an ellipse but it may suffice that the shape is made longer on the side of the emission surface. In other words, it may suffice that the distance from the center of the scintillator 5 to the end of the incident surface 3*a* is different from the direction opposing to that of the emission surface and the distance in the direction of the emission surface is longer.

Then, the shape in which the bent portion 3*f* is partially or entirely formed into an arc is to be described with reference to FIGS. 7(*c*) and (*d*). The cross sectional shape 3/1 in the bent portion is an arcuate shape of this embodiment. The cross sectional shape 3/1C (shown by dotted line) is a cross sectional shape where the arc center CP1 is present within a plane SP (shown by dotted line) including the incident surface 3*a* in which the tangential line rising from the incident surface 3*a* of the cross sectional shape 3/1C is in parallel with the normal line 3*a*N on the incident surface. The cross sectional shape 3/1C is a shape of a bent portion in a case of configuring a light guide with no tilted portion shown in FIG. 7(*a*), and it can be said that this is the simplest shape as the bent portion.

The cross sectional shape 3/1 is a configuration in which the center CP2 of the arc is not present in the plane SP and is lower than the incident surface 3*a* (direction parting from the light guide 3). Further, a tangential line 3/1T rising from the incident surface 3*a* of the cross sectional shape 3/1 and a normal line 3*a*N on the incident surface are in a shape having a predetermined angle $\theta_t$. The angle θt is preferably in a range of about 2 degrees to 10 degrees with a viewpoint of improving the light utilization efficiency. The angle θt of the light guide 3 shown in FIG. 7(*b*) is 2.5 degrees. Further, the distance between the center CP2 and the plane SP is 1 mm. The distance is preferably within a range of about 0.3 mm to 5 mm.

In a case where the surface of the light guide 3 is divided along a line into a curved outer surface and a curved inner surface, the cross sectional shape 3/1 is contained in a curved outer surface starting from the end of the incident surface 3*a* and the cross sectional shape 3/2 is contained in the curved inner surface. In the configuration described above, the curved outer surface has a tangential line tilted from the normal line 3*a*N on the incident surface to the side of the incident surface at a contact point between the curved outer surface and the incident surface 3*a*.

Figure 7D:
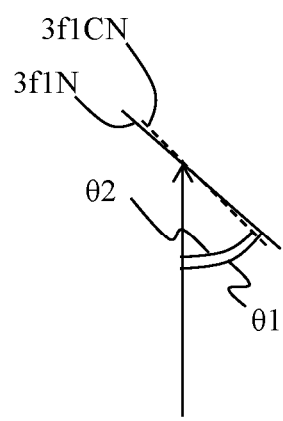

Light RayF11 is light emitting from almost the center of the incident surface 3*a* to the bent portion in parallel with the normal line 3*a*N on the incident surface. The intensity of light generated from the scintillator 5 is generally highest in the direction and at the position. Reference numerals 3/1N, 3/1CN respectively show normal lines at the intersections between the cross sections 3/1 and 3/1C and light RayF11. Angles $\theta_1$, $\theta_2$ are angles formed between the normal line 3f1N and light RayF11, and between 3f1CN and light RayF11 respectively. FIG. 7(d) is a view for comparison between angles θ₁ and θ₂ in which intersections between light RayF11 and each of cross sections are aligned. As can be seen from the drawing, the angle θ₁ is larger than the angle θ₂. Accordingly, since the incidence angle of light RayF11 to the cross section 3f1 is larger, the ratio of totally reflecting optical fluxes is increased among the optical fluxes incident to the light guide 3 and the Fresnel reflectivity is further increased, so that the light leakage is decreased to improve the light utilization efficiency.

That is, the light utilization efficiency is improved in a case where a portion of the cross sectional shape 3f1 (desirably, a portion where RayF11 is incident) is arcuate and the center CP2 of the arc is not present in the plane SP containing the incident surface 3a. Further, the light utilization efficiency is improved in a case where the tangential line 3f1T rising from the incident surface 3a of the cross sectional shape 3f1 and the normal line 3aN on the incident surface are in a shape having a predetermined angle $\theta_r$.

It is preferred that the cross sectional shape 3g1 and the cross sectional shape 3g2 in the tilted portion are substantially in parallel as in this embodiment. Because, when the height of the light guide decreases toward the emission surface 3b as shown in FIG. 7(b), the incident angle to the cross sectional shape 3g1 is decreased on every incidence of light to the cross sectional shape 3g1, while, since the incident angle to the cross sectional shape 3g2 increases on every incidence of light to the cross sectional shape 3g2 (the phenomenon is reversed in a case where the height of the light guide increases), the incident angle is compensated. Accordingly, this provides an advantageous effect that the incident angle upon initial incidence to the tilted portion 3g does not change greatly in the course of the light guidance and the incident angle is decreased to less than the total reflection angle to suppress occurrence of light leakage.

In this embodiment, the cross sectional shapes 3f1, 3f2 in the bent portion are arcuate but this is not restrictive and they may be a curve or a polygonal line deviated from an equation of a circle. However, the outer cross sectional shape 3f1 of the bent portion is desirably a configuration to be partially fitted by using an equation of a circle, ellipse or hyperbola.

Figure 8:
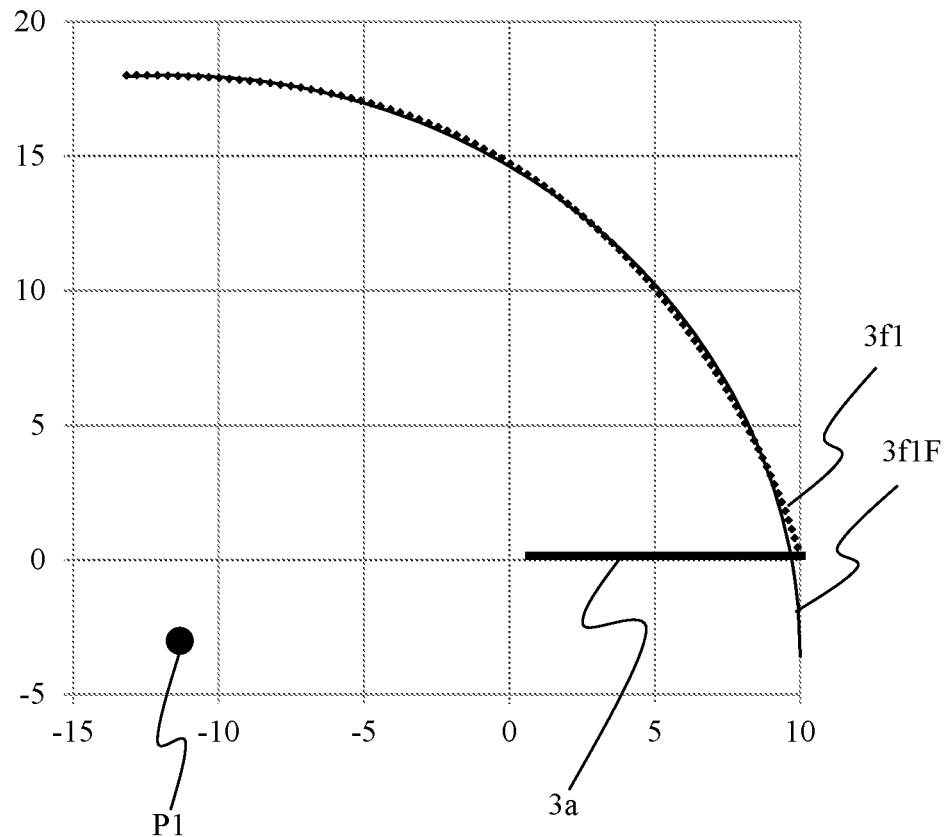
FIG. 8 is a view illustrating an example of fitting a cross sectional shape of a bent portion by using an equation of a circle.

An example of fitting the cross sectional shape 3f1 in the bent portion by using an equation of a circle is to be explained with reference to the graph of FIG. 8. For the reference, the position of the incident surface 3a was described in the graph. In the graph, the cross sectional shape 3f1 is described in the direction opposite to the cross sectional shape of the light guide described in FIG. 6 and FIG. 7. The abscissa represents a positional coordinate [mm] in parallel with the incident surface and the ordinate represents the positional coordinate [mm] in the direction parallel with the normal line on the incident surface. The dotted line is an example of the cross sectional shape 3f1 in the bent portion, which is not a complete arc. The solid line 3iF is a result of fitting by the equation of a circle. The dotted line and the solid line are well aligned except for the vicinity of the end of the incident surface 3a. The center P1 of the arc, etc. may be determined by using the result of fitting.

In this embodiment, a circle, a partial circle and an ellipse, or the like is used for the shape of the incident surface 3a and the emission surface 3b, but the present invention is not restricted to them. For example, in a case where the scintillator 5 is a quadrangular prism, the incident surface may also be square and where the shape of the photoreceiving element is square, the emission surface may also be square, and various shapes may be considered. Further, the cross sectional shape of the surface in parallel with the emission surface is not restricted to the circle or the like, and various shapes such as a square or hexagonal shape may be considered.

<<Third Embodiment>>

FIG. 9 is a view for explaining a third embodiment. Identical portions or portions having identical functions with those of the first embodiment are not explained. Further, portions carrying identical reference numerals are those portions having similar functions. The difference from the first embodiment is that a side prism 3e is provided to a light guide 3 having a bent portion 3f. FIG. 9 is a cross sectional view taking notice on the bent portion 3f and the side prism 3e. The shape of the light guide 3 of this embodiment is identical with the light guide which has been explained with reference to FIG. 6(b) in the second embodiment except for the portion provided with the side prism 3e.

Figure 9A:
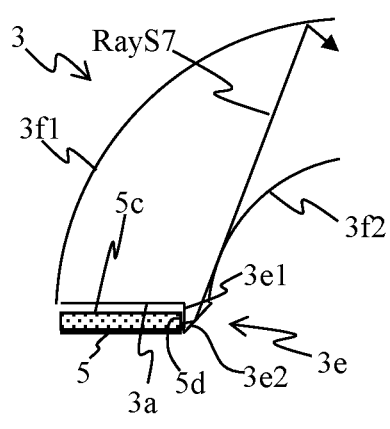
FIGS. 9A and 9B are views explaining a specific shape of the light guide.

FIG. 9(a) is an example of providing a side prism 3e to a position of the incident surface 3a to which the scintillator 5 is not faced. The portion is at the top end in the direction of the major axis of an ellipse of the incident surface 3a to which light is scarcely incident, and it gives no effect on the shape of the light guide subsequent to the incident surface 3a, thus also on light guidance. Accordingly, in a case of providing the side prism 3e to the position, the shape of the light guide subsequent to the incident surface 3a and the side prism 3e can be optimized independently.

Provision of the side prism 3e provides an advantageous effect of improving the light utilization efficiency. As described in the first embodiment with reference to FIG. 4, the side prism 3e can be modified into various forms. Particularly, the light utilization efficiency can be improved effectively by providing a reflection member to the surface of the reflection surface 3e2. Reference numeral RayS7 shows an example of light.

Figure 9B:
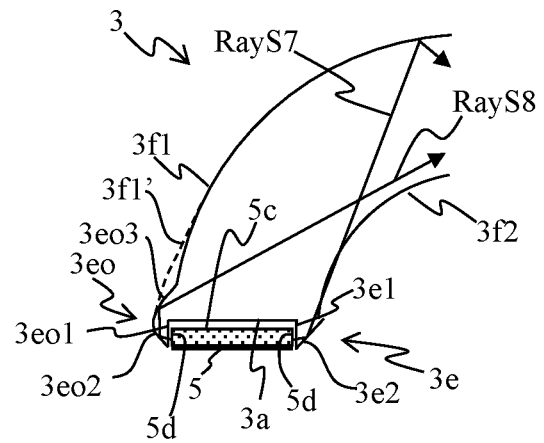

FIG. 9(b) is an example of providing a side prism 3eo also to the outer bent portion 3f1, and the outer side prism 3eo has two or more reflection surfaces since it is necessary to rotate the propagation direction of light by about 180 degrees and reflect light to the emission surface. That is, the side prism 3ec has a reflection surface shape of reflecting light twice or more. FIG. 9(b) shows an example of having a side prism incident surface 3eo1 facing the side 5d of the scintillator 5 for incidence of light from the side 5b, reflecting the light substantially in the normal line direction at the incident surface 3a at the reflection surface 3eo2 and reflecting light at the reflection surface 3eo3 substantially in the direction of the emission surface 3b. Such a configuration provides an advantageous effect of improving the light utilization efficiency. However, in a case of the outer side prism 3eo, since it changes the cross sectional shape 3f1, this given an effect on light guidance. Accordingly, it is preferred to reduce the shape so as not to generate remarkable light leakage under the effect of the side prism 3eo and not to lower the light utilization efficiency as a whole. Further, it is preferred, for example, that the reflection surface 3eo3 is formed to a continuous shape as far as a substantially identical position with that of the incident surface 3a as a portion of the cross sectional shape 3f1 as in the cross sectional shape 3f1' shown by the dotted line. Reference numeral RayS8 is an example of light.

A modification of FIG. 9(b) is to be described with reference to FIG. 10. FIG. 10(a) is a cross sectional view taking notice on a bent portion 3f and a side prism 3e. This modification and the example of FIG. 9(b) are different in the configuration in that a gap is provided between the outer side prism 3*eo* and the bent portion 3*f*. As described above, since modification to the cross sectional shape 3*f*1 gives an effect on light guidance, the gap is provided so as not to give the effect. Light incident from the incident surface 3*a* is guided under reflection on the cross sectional shape 3*f*1 and 3*f*2, while light incident from the side prism incident surfaces 3*e*1 and 3*eo*1 is guided under reflection on the side prisms 3*e* and 3*eo*.

FIG. 10(*b*) is a cross sectional view for explaining the side prism 3*eo* more specifically. Light is incident from a surface 3*eo*1 facing the scintillator, reflects on the reflection surfaces 3*eo*2 and 3, emits from the side prism emission surface 3*eo*4 facing the bent portion 3*f* and is then incident to the bent portion 3*f*. For the reflection surfaces 3*eo*2 and 3*eo*3, various modifications are possible as explained in first embodiment with reference to FIG. 4. For example, the reflection surface 3*eo*2 and the reflection surface 3*eo*3 may be formed as a continuous curved surface. In this case, it may suffice that the curved surface has a function of reflecting light substantially in the direction of the normal line on the incident surface 3*a* and subsequently, reflecting light substantially in the direction of the emission surface 3*b*. Provisions of a reflection member such as of aluminum to the reflection surfaces 3*eo*2 and 3*eo*3 can improve the light utilizing efficiency effectively.

Further, while the portion between the side prism emission surface 3*eo*4 and the bent portion 3*f* is entirely shown as a gap, the portion may be partially joined. For example, a portion of the side prism emission surface 3*eo*4 nearer to the incident surface 3*a* may be joined with the bent portion 3*f*. This is because the effect of light incident from the incident surface 3*a* on the light guidance is small if the joint portion is small.

The outer side prism 3*eo* and the light guide 3 may be integrated but they may be formed separately and the side prism 3*eo* may be attached to the light guide 3 for providing the gap.

Figure 11A:
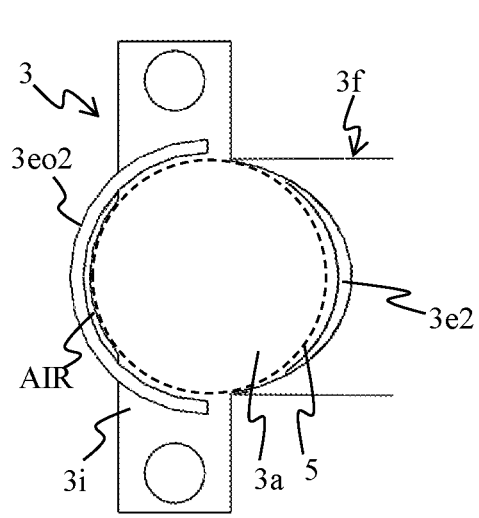
FIGS. 11A to 11C are views observing a light incident surface of the light guide in various directions.
Figure 11B:
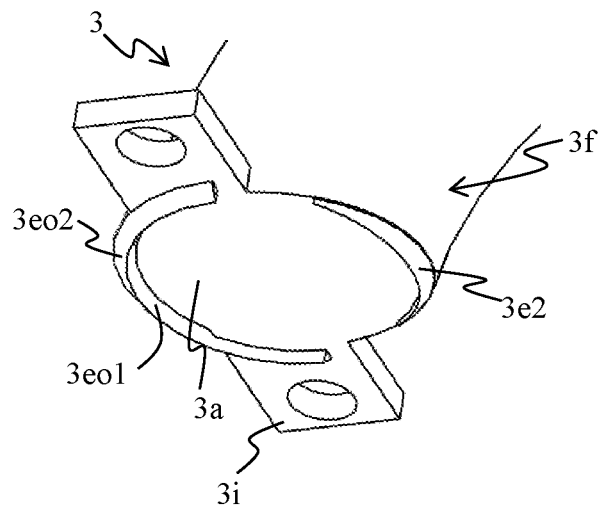
Figure 11C:
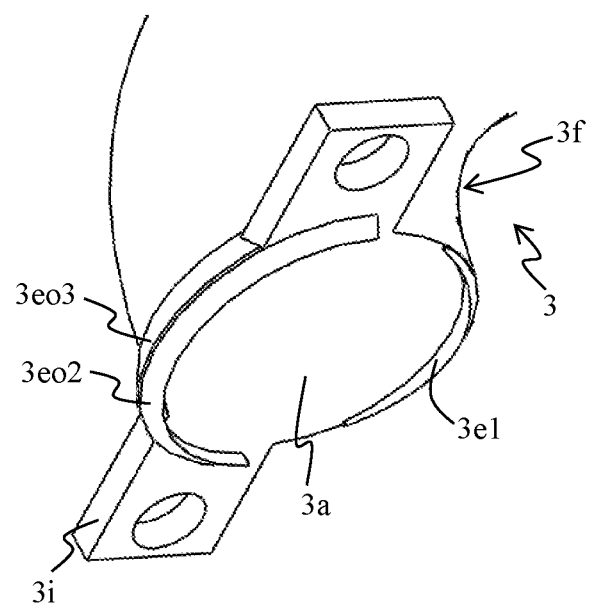

FIG. 10(*c*) is a perspective view in the direction of observing the incident surface 3*a*. FIG. 11(*a*) is a view of a light guide observed from the direction of an arrow a (in the direction of the normal line at the incident surface 3*a*). FIG. 11(*b*) is a view observing in the direction of the arrow b in the drawing and FIG. 11(*c*) is a view observing in the direction of the arrow c in the drawing. Referring to FIG. 11(*a*), it can be seen that the side prisms 3*e* and 3*eo* are arranged along the scintillator 5 (shown by dotted line). A gap AIR is present between the incident surface 3*a* and the outer side prism 3*eo*.

The configuration of this modification provides an advantageous effect of improving the light utilization efficiency while eliminating the effects of the incident light from the incident surface 3*a* on light guidance due to provision of the side prism 3*eo*.

Figure 12:
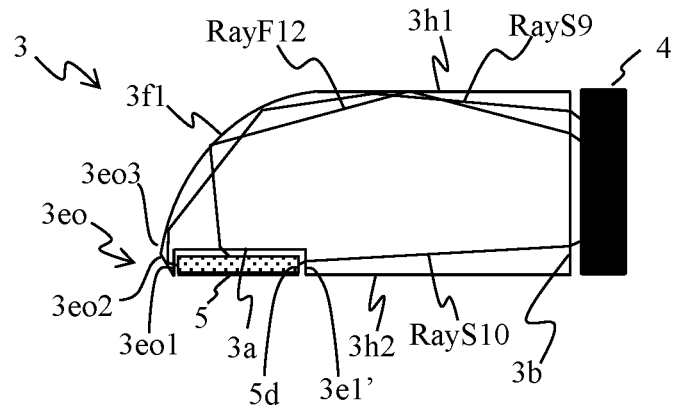
FIG. 12 is a view explaining a specific shape of the light guide.

Next, another modification is to be explained with reference to FIG. 12 showing the cross section at a plane S1. This modification is a case where one curve is present in the cross sectional shape of the bent portion 3*f*. A portion of light incident from the incident surface 3*a* reflects on the cross sectional shape 3*f*1, is incident to a linear portion 3*h*, and then guided as in the example of light RayF12. A portion of light incident from the side prism incident surface 3*eo*1 reflects on the reflection surface 3*eo*2, reflects on the reflection surface 3*eo*3 joined continuously with the curved surface of the bent portion 3*f*, and is then guided to the emission surface 3*b* as in the example of light RayFS9. Light incident from the side wall 3*e*1' is guided to the emission surface 3*b* as in the example of light RayS10. In this modification, omnidirectional light emitted from the scintillator 5 can be taken into and guided through the light guide 3 by providing a curved surface facing the incident surface 3*a*, an incident surface 3*a*, a containment space surrounded with a side prism incident surface 3*eo*1 and a side wall surface 3*e*1', and a side prism 3*eo*1 to provide an advantageous effect of improving the light utilization efficiency. The containment space of this modification has light incident surfaces facing all the surfaces that emit light of the scintillator 5 and provides an advantageous effect of improving the light utilization efficiency also by having a light incident surface facing a portion of the light emission surface of the scintillator 5.

Figure 13:
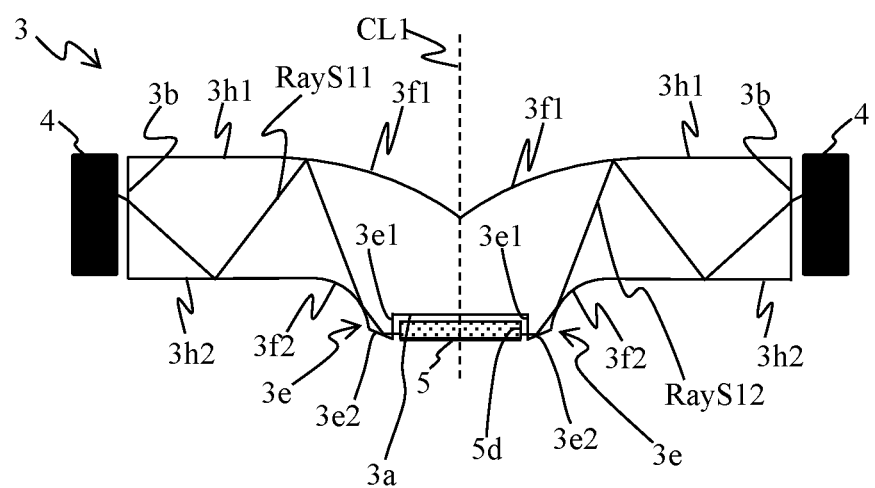
FIG. 13 is a view explaining a specific shape of the light guide.

Then, another modification is to be described with reference to FIG. 13 illustrating a cross section at the plane S1. This modification has such a configuration that photoreceiving elements 4 are disposed on both left and right sides at a certain cross section and a light guide 3 is biforked at a position facing a scintillator 5 for propagating light to both sides. This modification has a cross section 3*f*1 which is right to left symmetry with respect to a center line CL1 passing the center of the scintillator 5. Because of the right to left symmetry, it is possible to reduce the angle of rotating the propagation direction of light incident from the incident surface 3*a* (substantially within 90 degrees). Generally, as the angle of rotating the light propagation direction is larger, it is more difficult to reflect light so as to reach the photoreceiving element 4 and light leaking from the light guide 3 is increased. Accordingly, by making the cross section 3*f*1 of the bent portion left to right symmetry with respect to the center line CL1, an advantageous effect of improving the light utilization efficiency is provided. This is a configuration where side prism incident surfaces 3*e*1 are arranged facing the sides 5*d* on both sides of the scintillator 5. Examples of light incident to respective photoreceiving elements 4 on both right and left sides were described as RayS11 and RayS12. In each of the examples, light is incident from each of the side prism incident surfaces 3*e*1, reflects on the reflection surface 3*e*2, and then reflect successively on the cross sectional shape 3*f*2 or 3*f*1, reflects on the linear portion 3*h*2, and are then incident from the emission surfaces 3*d* to the photoreceiving element 4. Also in the configuration where the photoreceiving elements 4 are arranged on both right and left sides, the light utilization efficiency can be improved by the configuration having the side prisms. In this configuration, light rotated by 180 degrees for the propagation direction by the side prism 3*e* is not or scarcely present. Accordingly, since the angle of rotating the propagation direction of light is small, an advantageous effect of improving the light utilization efficiency is provided. Further, since the side prism 3*eo* disposed to the outer bent portion 3*f*1 shown in FIG. 9(*b*) is not present, the outer bent portion 3*f*1 and the side prism 3*e* can be optimized independently to provide an advantageous effect of improving the light utilization efficiency. In FIG. 13, a tilted portion is not present between the cross section 3*h*1 in the linear portion and the cross section 3*f*1 in the bent portion, but it may be configured to increase the radius of curvature in the cross section 3*f*1 in the bent portion to improve the light utilization efficiency and have a tilted portion.

In view of the above, a configuration of providing photoreceiving elements 4 on both sides as viewed for a certain cross section provides an advantageous effect of improving the light utilization efficiency. Further, the reflection surface 3*e*2 can be in various shapes as explained with reference to the first to third embodiments 3. In a case where the scintillator 5 has a doughnut-like shape where particles such as a primary electron beam 100 are passed through along the center line CL1, a through hole may be provided along the center line CL1 of the light guide 5. For the through hole, various shapes such as circle or square form may be considered. Explanation has been made in the first embodiment to the third embodiment, but matters described above may be properly combined and combination thereof may sometimes provide a higher effect.

With the constitutions described above, the light utilization efficiency can be improved.

REFERENCE SIGNS LIST 1 electron microscope
2 electron source
3 light guide
4 photoreceiving element
5 scintillator
6 signal particle control plate
50 sample
60 electron optical column
61 sample chamber
100 primary electron beam
101 secondary particle

The invention claimed is:

1. A light guide for guiding light generated from a scintillator to a photoreceiving element, comprising:
a scintillator containment portion formed of a first surface facing a surface opposite to a charged particle incident surface of the scintillator and a second surface facing a surface different from the surface opposite to the charged particle incident surface of the scintillator; and a tilted surface for reflecting light incident from the second surface to the inside of the light guide;
a bent portion for guiding light incident from the first surface and the second surface to different directions;
an emission surface formed to a position facing the photoreceiving element;
a linear portion for guiding light to the emission surface; and
a tilted portion formed between the linear portion and the bent portion.

2. The light guide according to claim 1, wherein the first surface is larger than the second surface.

3. The light guide according to claim 1, wherein the tilted surface is provided with a reflection member.

4. The light guide according to claim 1, wherein the tilted surface is formed of a plurality of surfaces in different directions or a curved surface.

5. The light guide according to claim 1, wherein the tilted surface situated outside of the bent portion is formed such that a relative angle between the incident light and the emission light is narrower relative to the tilted surface positioned inward of the bent portion.

6. A charged particle beam device comprising a light guide having a light incident surface, an emission surface for emitting light incident from the incident surface, and a surface for guiding light incident from the incidence surface to the emission surface, wherein
the surface has a curved outer surface starting from the end of the incident surface, and
the curved outer surface has a tangential line tilted from the normal line on the incident surface to the incident surface at a contact between the curved outer surface and the incident surface, and
a scintillator containment space including the incident surface and a side wall surface having a surface direction in the direction different from the incident surface and a reflection surface for reflecting light incident from the side wall surface are formed.

7. The charged particles beam device according to claim 6, wherein the reflection surface is in a shape of reflecting light twice or more.

8. The charged particle beam device according to claim 6, wherein a curved surface is present to a portion of the light guide between the incident surface and the emission surface.

9. The charged particle beam device according to claim 6, wherein the curved outer surface has a portion capable of approximating with an equation of a circle and the center of the circle is not present in a plane parallel with the incident surface.

* * * * *